United States Patent [19]
Flickinger et al.

[11] Patent Number: 5,901,340
[45] Date of Patent: * May 4, 1999

[54] WIDEBAND SIGNAL DISTRIBUTION SYSTEM

[75] Inventors: Steven Lee Flickinger, Hummelstown; James Ray Fetterolf, Sr., Mechanicsburg; Joseph P. Preschutti, State College; Terry P. Bowen, Etters, all of Pa.

[73] Assignee: The Whitaker Corporation, Wilmington, Del.

[*] Notice: This patent is subject to a terminal disclaimer.

[21] Appl. No.: 08/548,038

[22] Filed: Oct. 25, 1995

Related U.S. Application Data

[63] Continuation-in-part of application No. 08/495,136, Jun. 28, 1995, abandoned.

[51] Int. Cl.⁶ .................................................. H04N 7/16
[52] U.S. Cl. ............................. 455/3.1; 348/6; 348/8
[58] Field of Search ................ 348/8, 6, 10, 11, 348/12, 13, 7, 5, 3, 2, 1; 455/3.1, 5.1, 6.1, 4.2, 6.2, 6.3; 379/90, 94, 397, 399, 334, 340, 398, 400; 370/480, 486, 487, 496, 535, 533, 534; H04N 7/16, 7/173

[56] References Cited

U.S. PATENT DOCUMENTS

| | | | |
|---|---|---|---|
| 2,013,140 | 9/1935 | Friis | 178/44 |
| 2,135,037 | 11/1938 | Landon | 250/20 |
| 3,665,311 | 5/1972 | Gargini | 325/53 |
| 3,835,393 | 9/1974 | Marron | 325/308 |
| 4,606,072 | 8/1986 | Martin et al. | 455/4 |
| 4,717,896 | 1/1988 | Graham | 333/25 |
| 4,766,402 | 8/1988 | Crane | 333/25 |
| 4,800,344 | 1/1989 | Graham | 333/25 |
| 5,130,793 | 7/1992 | Bordry et al. | 358/86 |
| 5,272,277 | 12/1993 | Humbles et al. | 174/48 |
| 5,363,432 | 11/1994 | Martin et al. | 379/90 |
| 5,374,952 | 12/1994 | Flohr | 348/12 |
| 5,485,630 | 1/1996 | Lee et al. | 455/4.1 |
| 5,528,283 | 6/1996 | Burton | 348/13 |
| 5,534,914 | 7/1996 | Flohr et al. | 348/15 |
| 5,585,837 | 12/1996 | Nixon | 348/8 |
| 5,592,482 | 1/1997 | Abraham | 348/8 |

FOREIGN PATENT DOCUMENTS

| | | | |
|---|---|---|---|
| 0 496 422A2 | 7/1992 | European Pat. Off. | G06F 3/14 |
| 2 626 119 | 7/1989 | France | H03H 11/04 |
| 990170 | 8/1960 | Germany . | |
| 2 173 077 | 10/1986 | United Kingdom | H04H 1/04 |
| 2 178 274 | 2/1987 | United Kingdom | H04H 1/02 |
| 2 243 038 | 10/1991 | United Kingdom . | |
| 2 263 604 | 7/1993 | United Kingdom | H04H 1/08 |

OTHER PUBLICATIONS

International Search Report, Application # PCT/US96/11191—Apr. 12, 1996.

*Primary Examiner*—Chris Grant
*Attorney, Agent, or Firm*—Salvatore Anastasi

[57] ABSTRACT

A wideband signal distribution system for distributing among a plurality of outlets wideband signals modulated onto RF carrier signals within a specified frequency band. The system functions as "passive" infrastructure and includes a distribution unit having a plurality of input ports, a plurality of output ports, a transmission path, a combiner for applying signals appearing at the plurality of input ports to the transmission path, and a splitter for applying signals appearing on the transmission path to all of the plurality of output ports. The system further includes a plurality of cables selected from the class of fiber optic cables, coaxial cables, and twisted pair wire cables, each extending between a respective one of the distribution unit ports and a respective one of the plurality of outlets, and a plurality of impedance matching devices, where such devices are appropriate for the type or types of cable used. Each of the devices terminates a respective end of a respective one of the cables. Distribution units can be cascaded utilizing combinations of cable, such as coaxial cable or optical fiber cable, to enhance functionality of the system.

24 Claims, 12 Drawing Sheets

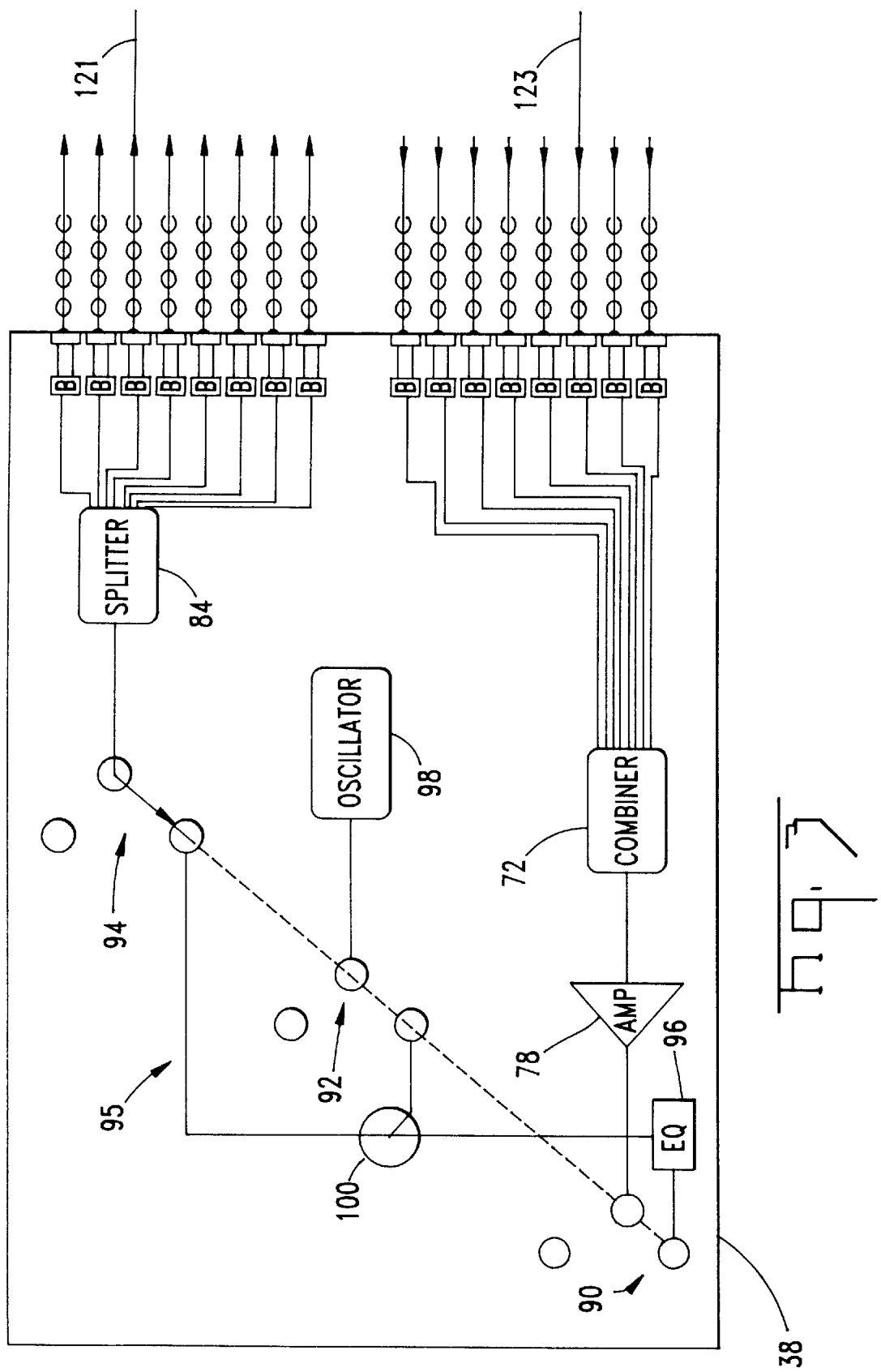

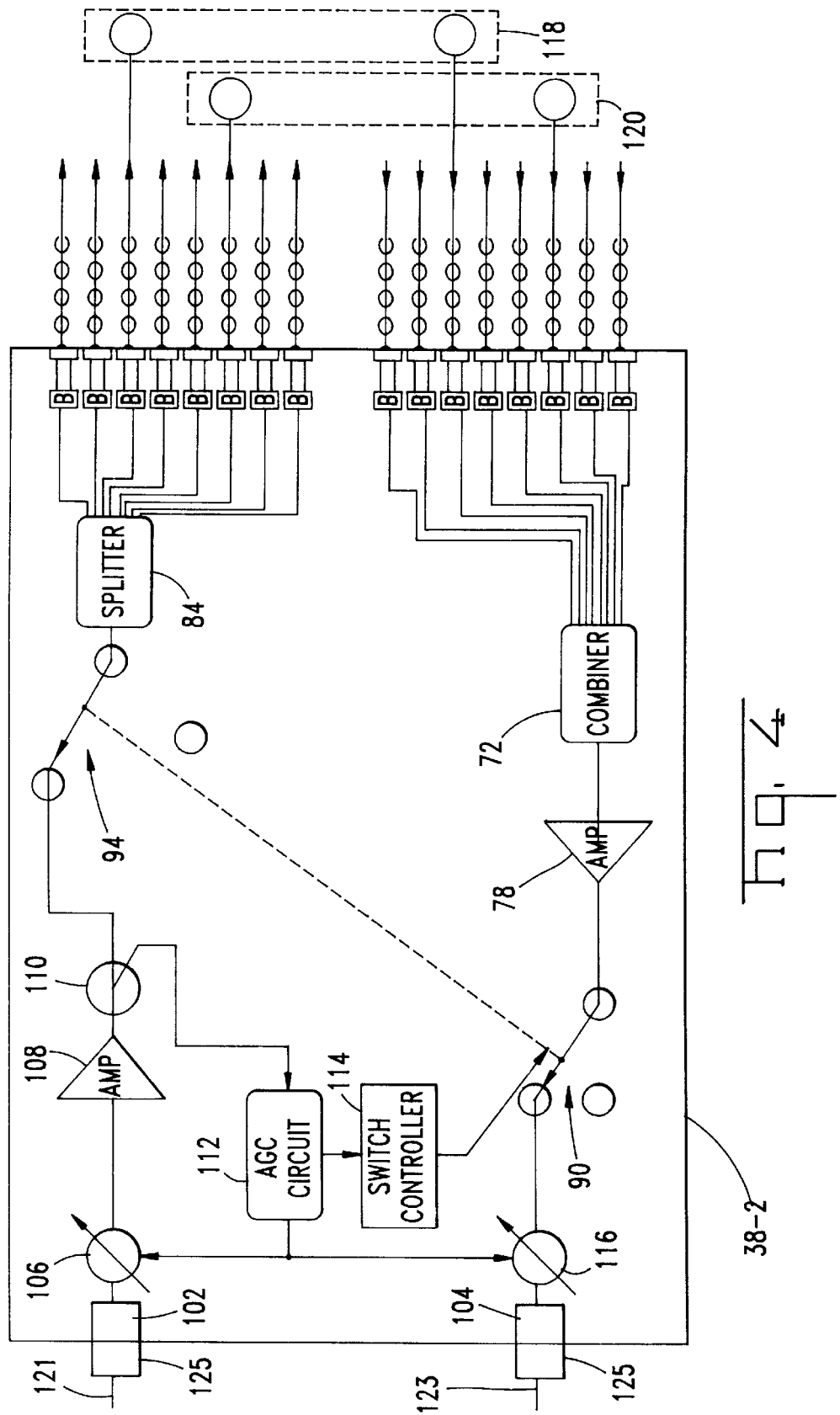

WIDEBAND SIGNAL DISTRIBUTION SYSTEM

RELATED APPLICATIONS

This application is a continuation-in-part of the invention described and claimed in U.S. Ser. No. 08/495,136, filed Jun. 28, 1995, now abandoned, and assigned to the assignee hereof. The prior application is directed primarily to the use of twisted wire pairs, i.e. insulated copper conductors spirally wound together, as the principal transmission medium for a wideband distribution system. The present invention expands on the applications of the distribution system by including a broader class of products for the transmission medium, which class may include the traditional twisted wire pairs and also coaxial cable, fiber optic cable, and combinations thereof. It will be appreciated that while twisted wire pairs may offer some cost advantages to the system, there are distance limitations, such as transmission loss and attenuation. In contrast, coaxial cable and fiber optic cable may be used over greater distances without the related problems. By way of example, fiber optic cable has the capability of transmitting over distances up to two kilometers. As will be apparent in the description which follows, the use of fiber optic cable alone or in combination with the other transmission media, can be indispensable for a large industrial complex or university campus.

BACKGROUND OF THE INVENTION

This invention is directed to a wideband signal distribution system, where the transmission medium may be selected from the class of products comprising twisted pair, coaxial cable, fiber optic cable, and combinations thereof. A preferred system is one which incorporates twisted pair as the primary distribution medium. In a combination system, for example, distribution units can be cascaded utilizing coaxial cable or optical fiber cable to enhance the functionality of the system.

There are numerous instances where it is desired to distribute over twisted pair coaxial cable, or fiber optic cable wire, within a relatively local area, such as a single building, wideband signals modulated onto RF carriers. A particular application is the distribution of video signals. For example, a school may have a number of classrooms and administrative offices, each having a television monitor, and it may be desired at a given time to provide a program to all of the classrooms and offices, originating either from a source within one of the classrooms or offices, such as a VCR, or from an outside source, such as a local cable system. Similarly, a corporation may have a building, or several closely spaced buildings, with numerous conference rooms equipped with television monitors and analogous program presentations may be desired. It is therefore a primary object of the present invention to provide cabling infrastructure for distributing wideband signals within a relatively local area.

Such cabling infrastructure should preferably possess certain attributes. For example, it should be relatively inexpensive. Further, it should be readily expandable. It is therefore a more specific object of this invention to provide such cabling infrastructure which possesses those attributes. New construction is commonly pre-cabled by the local telephone company. Typically, Category 5 twisted pair cable is utilized for such pre-cabling. This cable includes four twisted pairs within its sheath. Category 5 twisted pair wire is capable of carrying wideband signals thereover. Accordingly, using pre-installed twisted pair wire as part of the desired cabling infrastructure would be cost effective. It is therefore a further object of the present invention to provide a cabling system for distributing wideband signals which preferably incorporate category 5 twisted pair wire.

In such cabling system, outlets at various locations would be connected by twisted pair wire cables to concentrators, or distribution units, which interconnect the various outlets. It is therefore another object of the present invention to provide such a distribution unit which is adaptable so that it can be used singly when the number of outlets in the system is within the capacity of a single distribution unit, or which can be used in a multiple configuration cascaded with other such distribution units to expand the system beyond the capacity of a single distribution unit. Further, such cascading may also be done with twisted pair wire cable, coaxial cable, or optical fiber cable.

SUMMARY OF THE INVENTION

The foregoing and additional objects are attained in accordance with the principles of this invention by providing a wideband cabling system which functions as "passive" infrastructure to distribute wideband signals modulated onto RF carriers within a specified frequency band among a plurality of outlets. The system includes a distribution unit, the subject of the companion case, having a plurality of input ports, a plurality of output ports, a transmission path, which may include coaxial cable, fiber optic cable, and twisted pair wire cable, transmission paths known in the art, a combiner for applying signals appearing at the plurality of input ports to the transmission path, and a splitter for applying signals appearing on the transmission path to all of the plurality of output ports. The system preferably includes a plurality of twisted pair wire cables, each extending between a respective one of the distribution unit ports and a respective one of the plurality of outlets, and a plurality of baluns, each of the baluns terminating a respective end of a respective one of the twisted pair wire cables.

A further aspect of this invention is the provision of incorporating into the system the use of coaxial cable, fiber optic cable, and combinations thereof with or without the traditional twisted wire pairs. This added dimension to the invention allows for the potential for a more expansive system, such as in a broad complex—a university campus being a prime example.

These features will become more apparent in the description which follows, particularly when read in conjunction with the accompanying drawings.

BRIEF DESCRIPTION OF THE DRAWINGS

The foregoing will be more readily apparent upon reading the following description in conjunction with the drawings in which like elements in different figures thereof are identified by the same reference numeral and wherein:

FIGS. 3 and 4 together illustrate the cascading of a pair of the distribution units shown in FIG. 2, showing one of the distribution units operating in the master mode and the other distribution unit operating in the slave mode, respectively;

DETAILED DESCRIPTION

Figure 1:
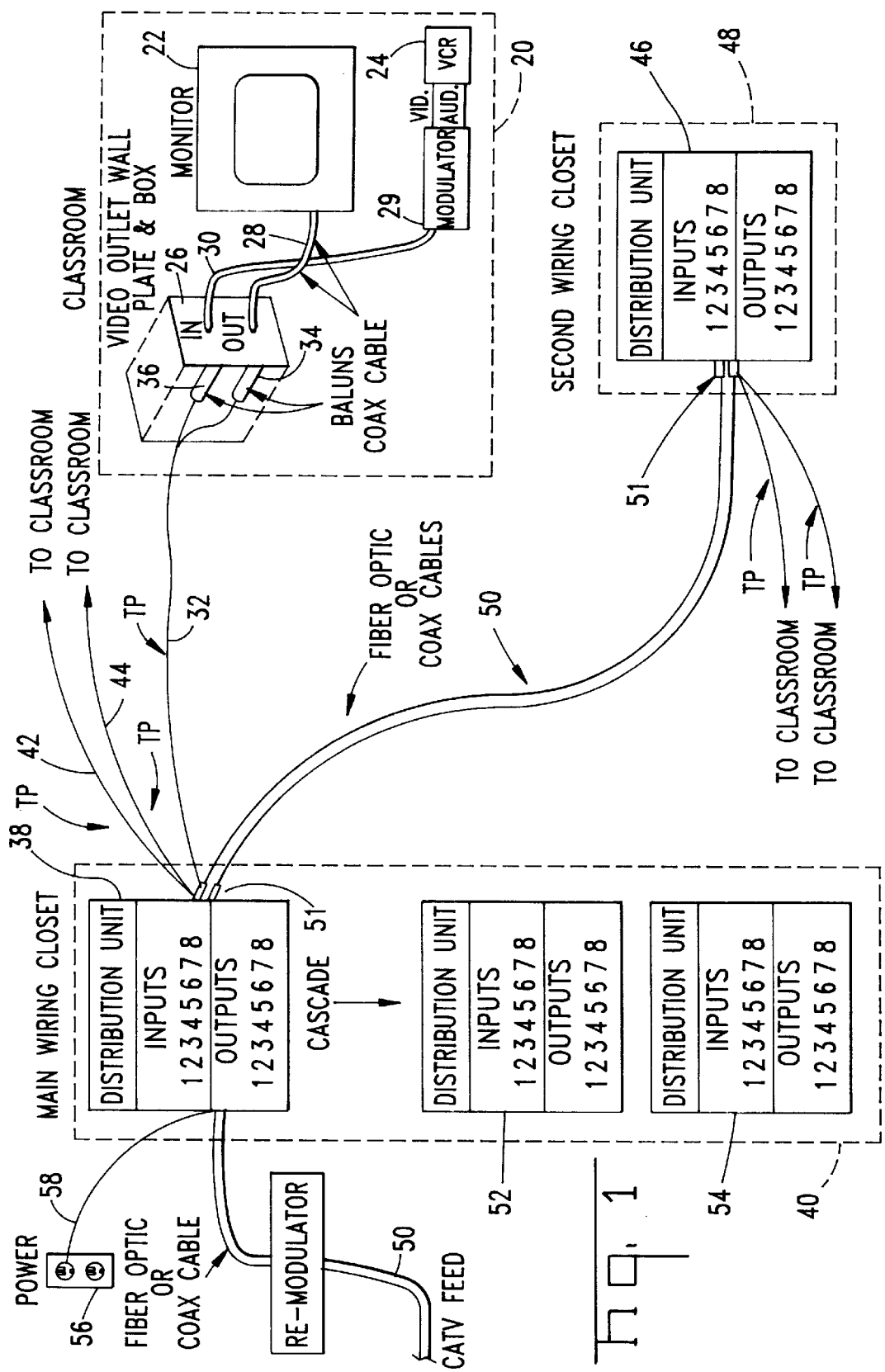
FIG. 1 is a pictorial representation of a cabling system constructed in accordance with the principles of this invention, illustratively for distributing video signals.

FIG. 1 represents in pictorial fashion a preferred cabling system according to the present invention installed within a school environment. For purposes of illustration, the system disclosed herein distributes video signals, but this invention can be utilized for distributing other wideband signals. As shown, a typical classroom 20 has a television monitor 22 and a source of video signals, illustratively a VCR, 24. The monitor 22 is connected to a wall outlet 26 by the coaxial cable 28. The VCR 24 is connected to the wall outlet 26 through the modulator 29 and the coaxial cable 30. Each of the cables 28, 30 is preferably connected to a respective twisted pair wire within the twisted pair cable 32 by means of a respective impedance matching device, or balun 34, 36, as hereinafter explained.

The twisted pair wire cable 32 is connected to input and output ports of the distribution unit 38 situated in the wiring closet 40. The distribution unit 38 is connected to additional classrooms via the twisted pair wire cables 42, 44 and is cascaded to another distribution unit 46 in a second wiring closet 48 by either coaxial cables or fiber optic cables 50 connected to the distribution unit 38 through impedance matching devices (IMDs) 51, such as a transformer for coaxial cable, an optoelectronic transceiver for fiber optic cable, or a balun for twisted pair wire cable. It will be understood, as indicated previously, that twisted pair wire cable could be utilized depending upon the distance between the wiring closets 40, 48. In any case, the distribution unit 46 is in turn connected to outlets in other classrooms preferably by respective twisted pair wire cables. Further, the distribution unit 38 may be cascaded to the distribution units 52, 54 within the same wiring closet 40.

The distribution unit 38 receives power from a standard power wall outlet 56 over the power cable 58. The other distribution units receive their power in a similar manner. In addition to the cabling system receiving video signals from an internal source such as the VCR 24 in the classroom 20, it may also receive video signals from an external source, such as a local cable TV system over the coaxial cable or optical fiber cable 50. Also, one or more classrooms or administrative offices in the school could have a video camera as a video signal source. As known, the video signals are modulated onto RF carriers within a specified frequency band.

Figure 2:
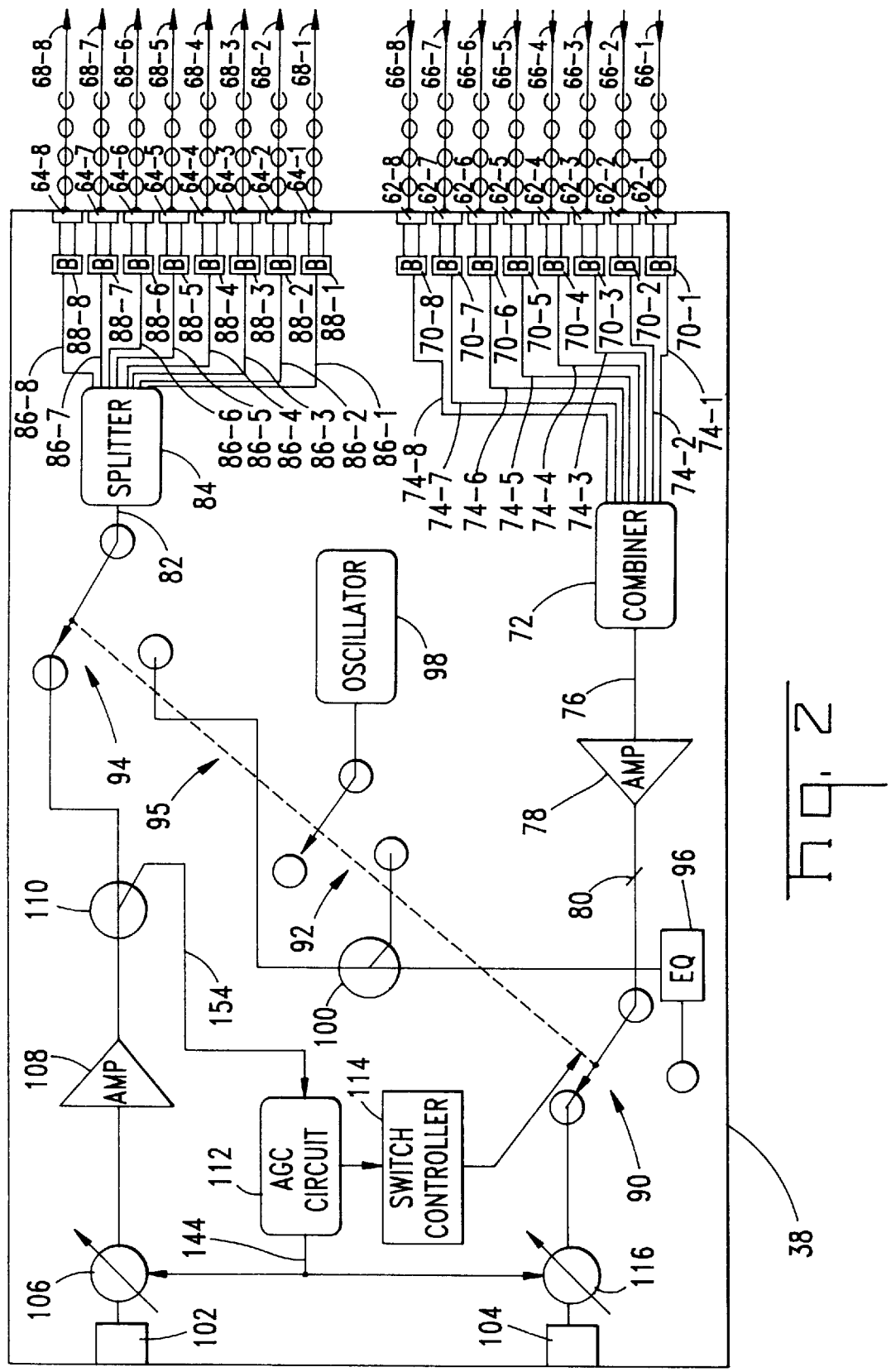
FIG. 2 is a block diagram of an inventive distribution unit for the system of FIG. 1.

As will be described in full detail hereinafter, each of the distribution units 38, 46, 52, 54 has eight input ports and eight output ports. If there are only eight outlets in the system, then a single distribution unit 38 can accommodate all the outlets. However, for more than eight outlets, at least one more distribution unit cascaded to the distribution unit 38 is required. In this situation, the distribution unit 38 is considered to be a "master" unit and the additional distribution unit is considered to be a "slave" unit. An attribute of the present invention is that the distribution units are identical and automatically configure themselves to operate either in the master mode or in the slave mode. Referring to FIG. 2, shown therein is a block diagram of a distribution unit 38 constructed in accordance with the principles of this invention and which may be utilized in the cabling system shown in FIG. 1. The distribution unit 38, utilizing twisted pair wire cable, includes eight input ports 62-1, 62-2, 62-3, 62-4, 62-5, 62-6, 62-7, 62-8 and eight output ports 64-1, 64-2, 64-3, 64-4, 64-5, 64-6, 64-7, 64-8. Each of the ports 62, 64 is adapted for connection to the two wires of a respective twisted pair 66, 68. The incoming signals at the input ports 62 are balanced signals (a characteristic of signals transmitted over twisted pair wire) and are coupled through respective baluns 70-1, 70-2, 70-3, 70-4, 70-5, 70-6, 70-7, 70-8 to the combiner circuit 72. The combiner circuit 72 is effective to additively combine, in a passive manner, all of the signals appearing at its inputs 74-1, 74-2, 74-3, 74-4, 74-5, 74-6, 74-7, 74-8 and provide a combined additive signal on its output lead 76. The output lead 76 is connected to the input of the amplifier 78, whose output lead 80 is connected to one part of a master/slave switch, to be described in full detail hereinafter.

Analogously, signals appearing on the input lead 82 to the splitter circuit 84 are passed through the splitter circuit 84 and provided, in unmodified form except for some attenuation, at the splitter outputs 86-1, 86-2, 86-3, 86-4, 86-5, 86-6, 86-7, 86-8. These signals are provided as inputs to the respective baluns 88-1, 88-2, 88-3, 88-4, 88-5, 88-6, 88-7, 88-8, which provide balanced signals to the output ports 64-1, 64-2, 64-3, 64-4, 64-5, 64-6, 64-7, 64-8 for subsequent transmittal in balanced form over the twisted pairs 681, 68-2, 68-3, 68-4, 68-5, 68-6, 68-7, 68-8.

FIG. 2 illustrates the master/slave switch as having three parts 90, 92, 94, with all of the switch parts being shown in the "slave" position. The default state of the master/slave switch is to its master position, so that the amplifier output 80 is coupled through the switch part 90 to a transmission path 95 including the equalizer 96, which connects the amplifier output 80 to the splitter input 82, through the switch parts 90, 94. At the same time, the switch part 92 couples the output of the oscillator circuit 98 to the transmission path 95 through the directional coupler 100. Thus, when the distribution unit 38 is operated in the master mode, the signals appearing at the input ports 62 are combined, looped back, combined with an oscillator signal, and transmitted out all of the output ports 64.

If the number of outlets in a cabling system is more than the capacity of a single distribution unit, illustratively eight outlets, one or more additional distribution units may be cascaded from the master distribution unit by connecting one of the output ports 64 of the master distribution unit to the signal inlet 102 of a "downstream" distribution unit and by connecting one of the input ports 62 of the master distribution unit to the signal outlet 104 of the downstream distribution unit. Thus, when the distribution unit 38 is a downstream distribution unit, the signals appearing at the signal inlet 102 pass through the variable attenuator 106 and to the amplifier 108. Part of the output of the amplifier 108 is extracted by the directional coupler 110 and passed to the automatic gain control (AGC) circuit 112. It will be recalled that when the distribution unit 38 is operating in its master mode, the oscillator circuit 98 provides a signal which goes to all of the output ports 64. This signal is a fixed frequency oscillating pilot signal which is outside the specified frequency band of the RF carriers. This pilot signal is sensed by the AGC circuit 112 and is utilized to control the attenuation of the variable attenuator 106. In addition, the pilot signal is provided to the switch controller 114 which is responsive to the presence of the pilot signal for controlling the master/slave switch to change to the slave position (as illustrated in FIG. 2). The output of the amplifier 108 then passes through the switch part 94 to the splitter circuit 84, from which it is applied to the output ports 64. Similarly, the output of the amplifier 78 passes through the switch part 90, through the variable attenuator 116, to the signal outlet 104, and from there to the upstream distribution unit. It is noted that the AGC circuit 112 controls the attenuation of the variable attenuator 116, as well as the variable attenuator 106. It is also noted that when the distribution unit 38 is in the slave mode, the oscillator circuit 98 is isolated and does not provide a pilot signal to the cabling system. Although variable attenuators 106, 116 have been illustrated, other controllable gain devices can be utilized.

Figure 3A:
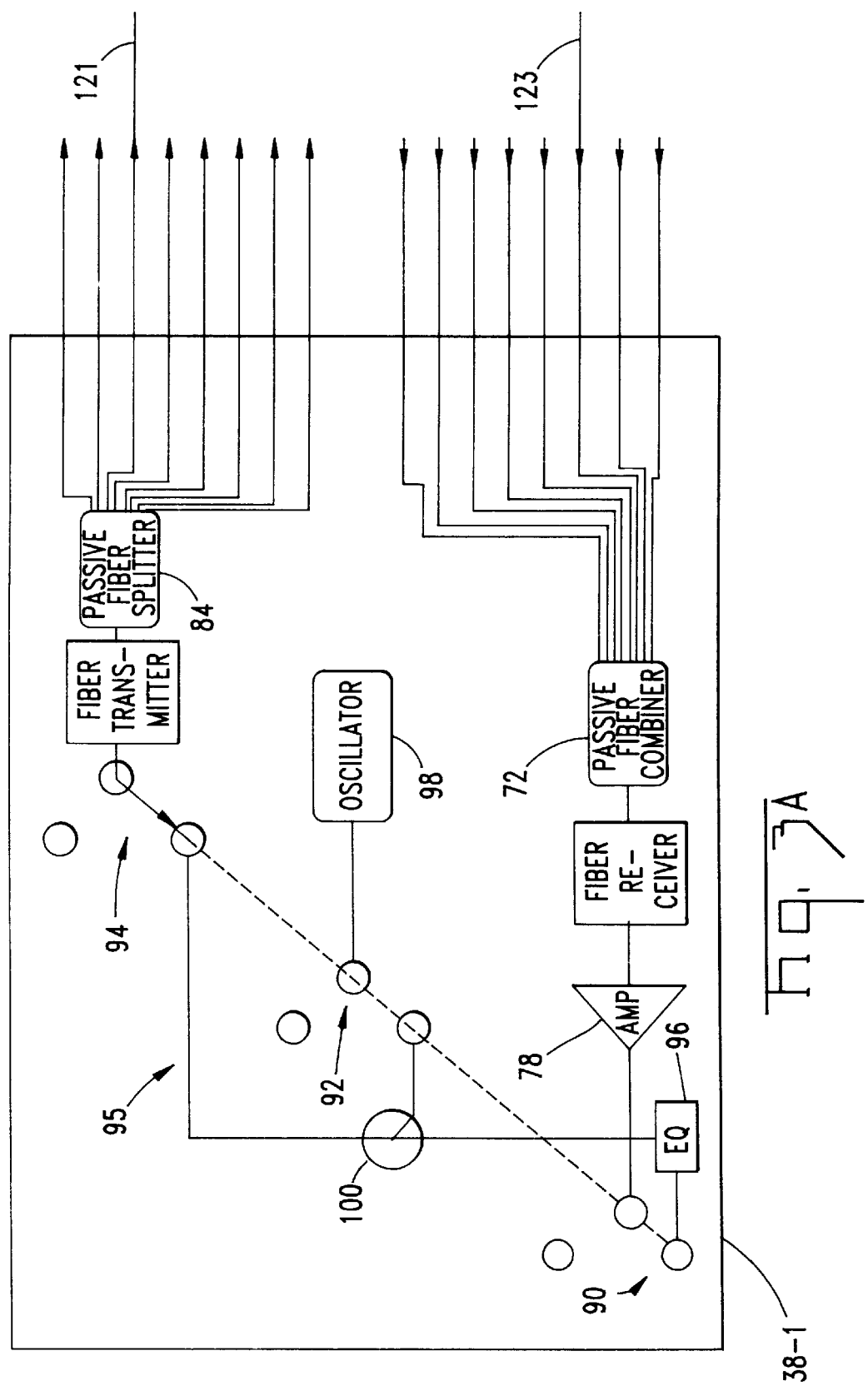
FIGS. 3A and 4A are block diagrams similar to FIGS. 3 and 4, showing, however, the incorporation of fiber optic cable into the distribution system of this invention.
Figure 4A:
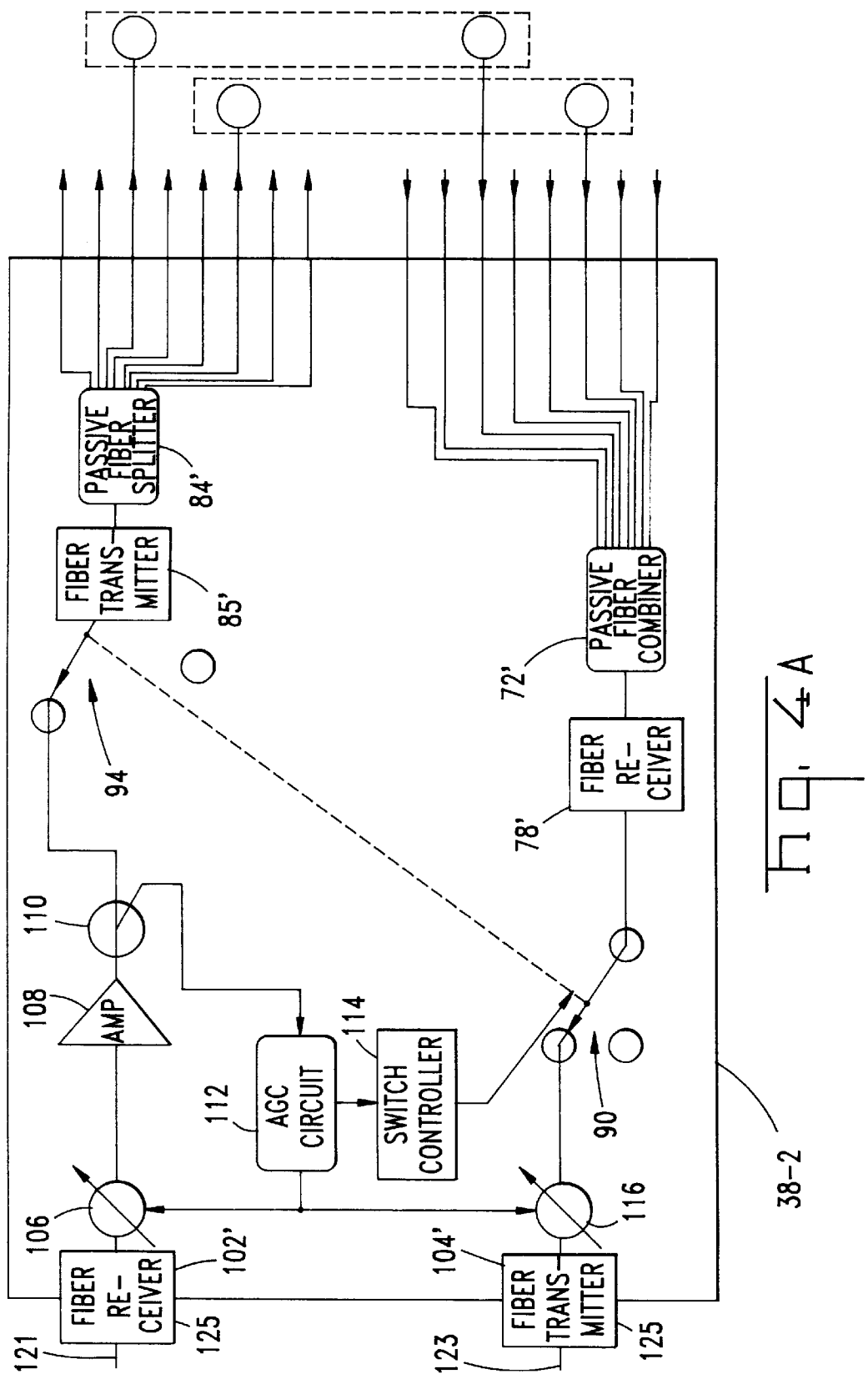

FIGS. 3 and 4 together illustrate a pair of identical distribution units 38 cascaded together, with the distribution unit 38-1 operating in the master mode and the distribution unit 38-2 being downstream and operating in the slave mode. Only those operative portions of the distribution units 38-1, 38-2 are illustrated in FIGS. 3 and 4. The distribution unit 38-2 is shown as being coupled to the two outlets 118,120 and the distribution unit 38-1 is shown as being coupled only to the distribution unit 38-2 via the twisted pairs 121, 123. However, it is understood that the remaining input/output ports of the two distribution units 38-1, 38-2 may be connected to additional outlets. Although twisted pairs 121, 123 are shown, it is understood that coaxial cables or optical fiber cables may be used instead. FIGS. 3A and 4A, companion block diagrams to FIGS. 3 and 4 respectively, represent a distribution unit where fiber optic cable may be incorporated into the system. In FIGS. 3A and 4A, like reference numerals are the same components identified with FIGS. 3 and 4, and the "prime" reference numerals represent functionally equivalent components suitable for fiber optic cable, for example. For the latter situation, reference numeral 72' is a passive fiber combiner, 78' a fiber optic receiver, 84' a passive fiber splitter, 85' a fiber optic transmitter, 102' a fiber optic receiver, and 104' a fiber optic transmitter. In any event, an impedance matching device (IMD) may be required for transforming between the balanced signals at distribution unit 38-1 and the unbalanced signals at distribution unit 38-2. Thus, when twisted pair wire cables are used, the baluns 125 are at the input to the distribution unit 38-2.

Thus, as shown in FIGS. 3 and 4, a signal originating from the outlet 120 enters the distribution unit 38-2, passes through the combiner circuit 72, the amplifier 78, the switch part 90, the variable attenuator 116 and enters the distribution unit 38-1. The signal then passes through the combiner circuit 72, the amplifier 78, the switch part 90 and the transmission path 95. In the directional coupler 100, the signal has added to it the pilot signal from the oscillator 98. This combined signal then passes through the switch part 94, the splitter circuit 84, exits the distribution unit 38-1 and enters the distribution unit 38-2. The combined signal then passes through the variable attenuator 106 and the amplifier 108. The combined signal is passed to the AGC circuit 112 by the directional coupler 110, where the pilot signal is extracted and utilized to control the attenuation of the variable attenuators 106, 116 and also to insure that the master/slave switch in the distribution unit 38-2 is in the slave state. The remainder of the signal leaves the directional coupler 110 and passes through the switch part 94 and the splitter circuit 84, from which it exits the distribution unit 38-2 and is transmitted to the outlets 118, 120.

Figure 5:
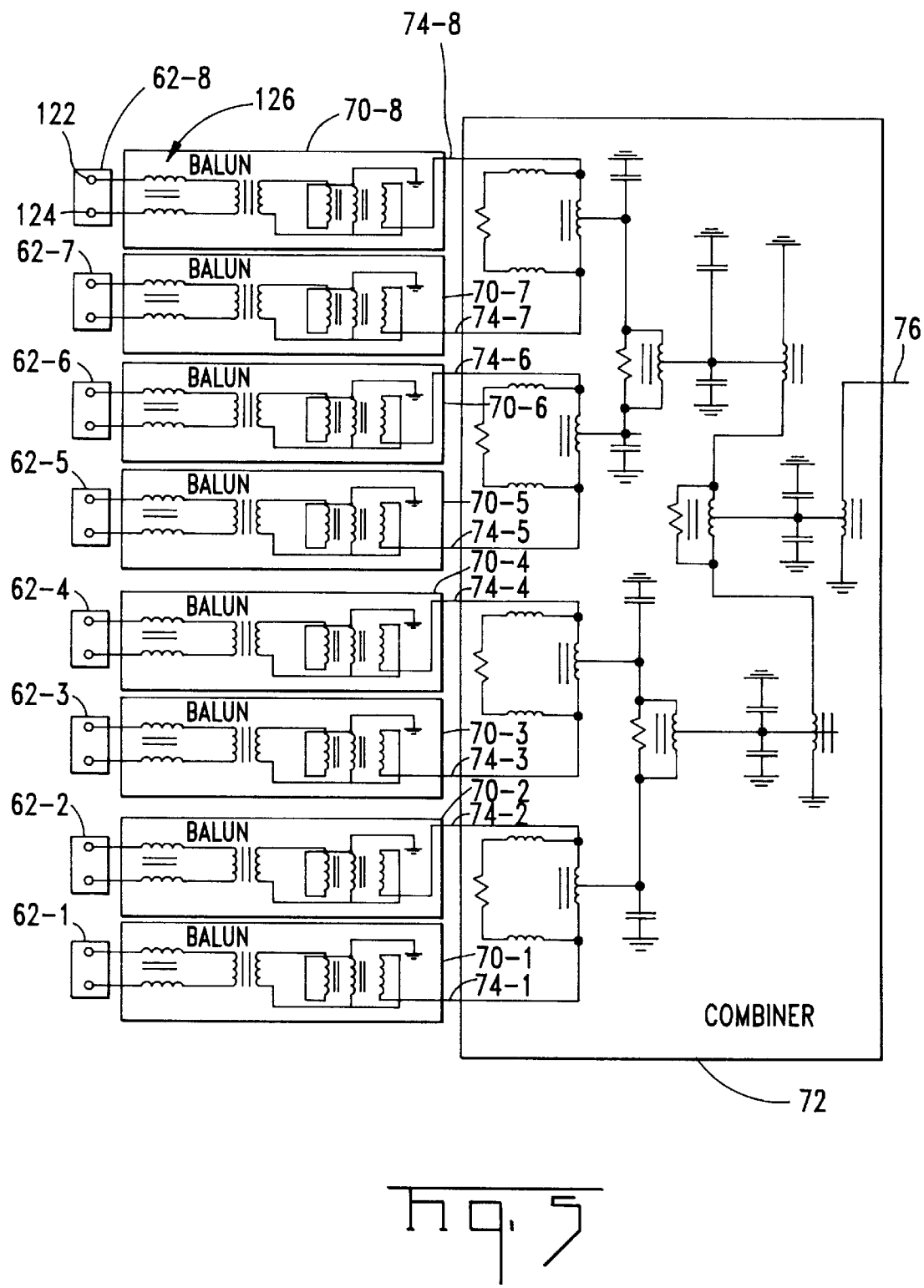
FIGS. 5–9 together form a detailed electrical schematic circuit diagram of an illustrative embodiment of the distribution unit shown in FIG. 2.

FIGS. 5–9 show a preferred illustrative circuitry which may be utilized for the distribution unit 38. FIG. 5 illustrates the input ports 62, the baluns 70 and the combiner circuit 72. As shown, each of the input ports 62 has a pair of input terminals 122, 124 adapted to be connected to a respective one of the wires making up a respective twisted pair 66. The input terminals 122, 124 are connected through a common mode choke 126 to the remainder of the balun circuitry 70, which is made up of inductively coupled coils, as is conventional and well known in the art. Thus, the balanced end of each of the baluns 70 is coupled to a respective one of the input ports 62 and the unbalanced end of each of the baluns 70 is connected to a respective one of the inputs 74 to the combiner 72. The combiner 72 is unpowered and comprised of passive elements (transformers, resistors, inductors, and capacitors) which additively combine signals on the inputs 74 to provide a combined additive signal on the output lead 76.

Figure 6:
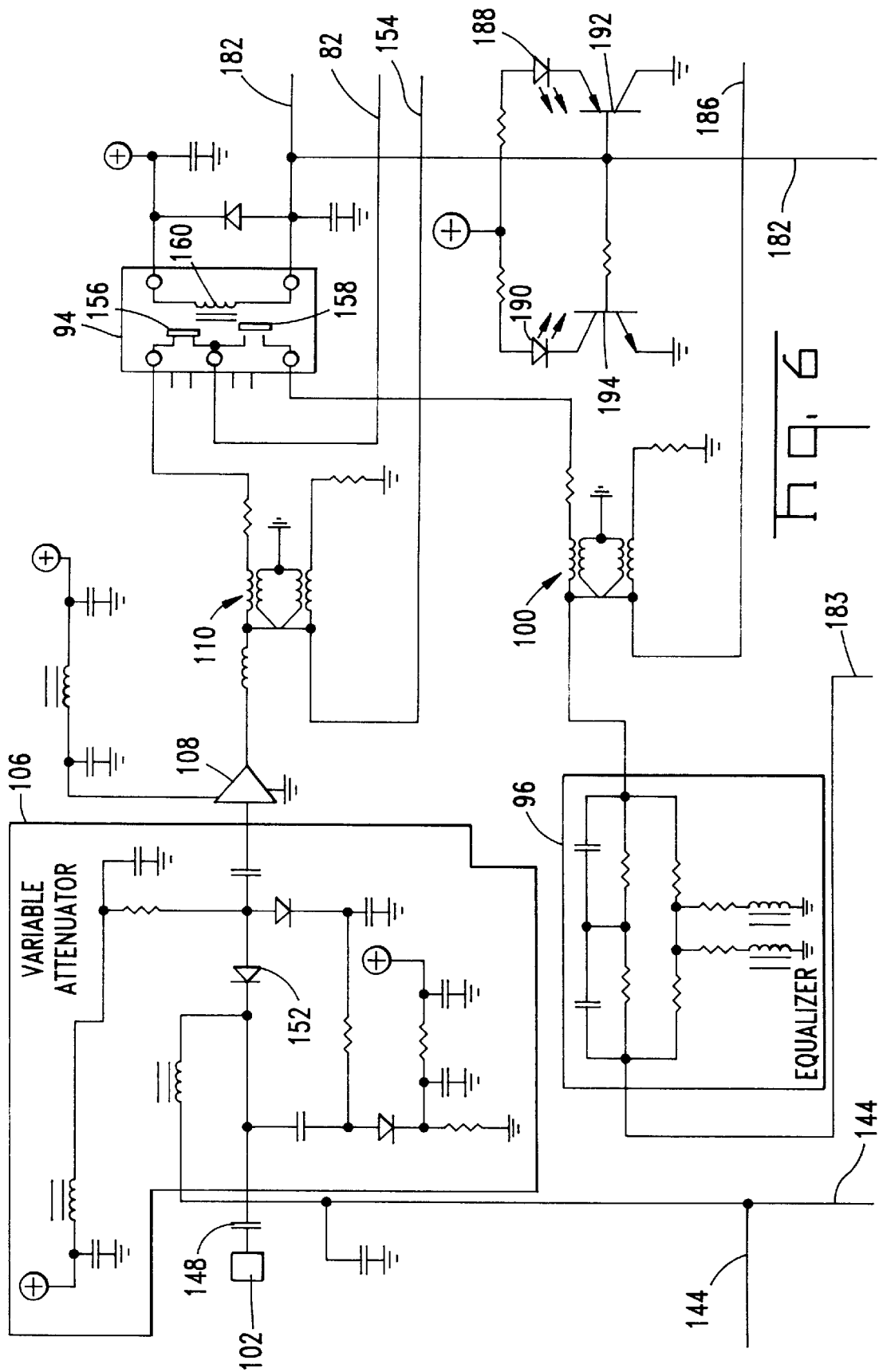
Figure 7:
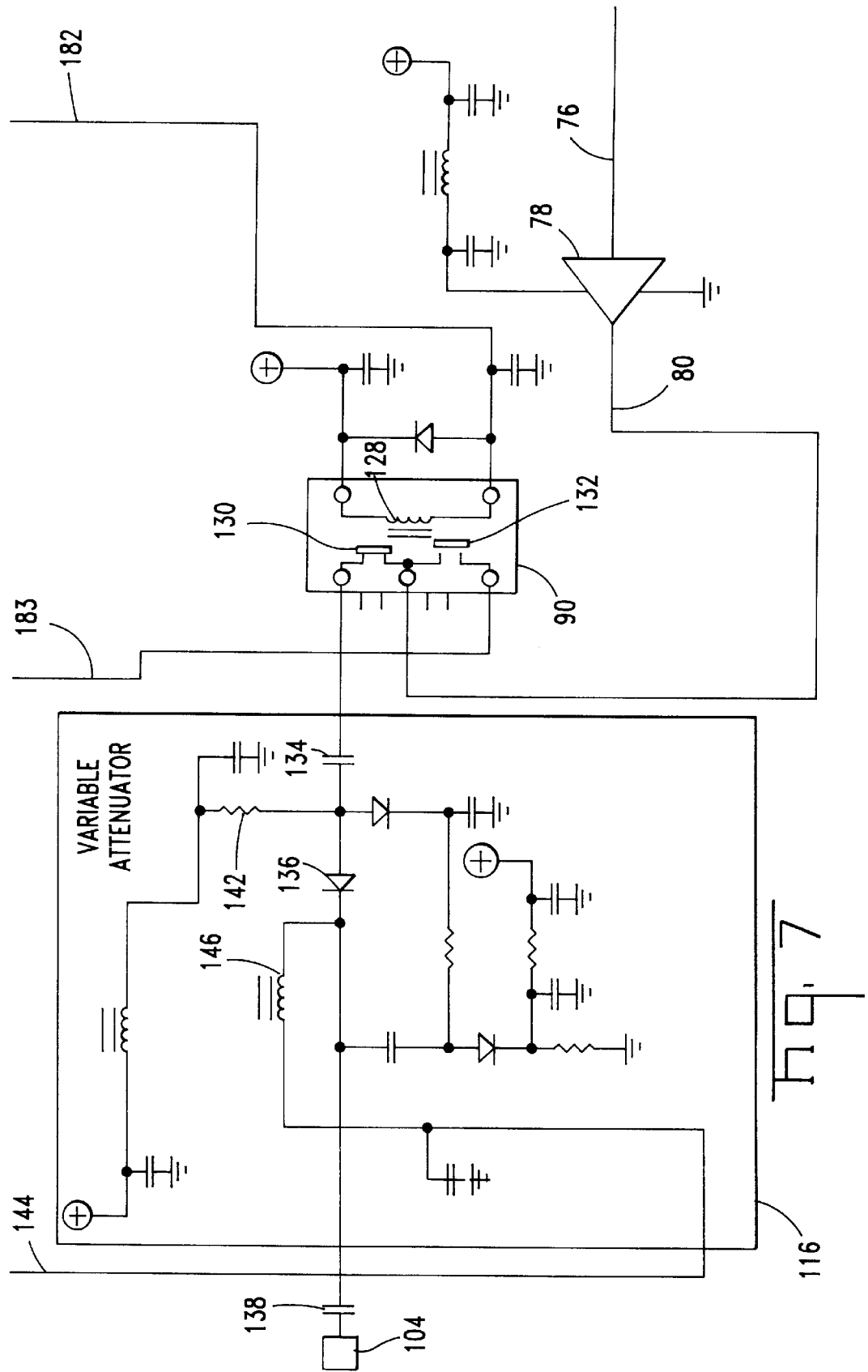

Referring to FIGS. 6 and 7, the combiner output 76 is applied as the input to the amplifier 78, which is illustratively a Motorola MHW1222 CATV RF hybrid amplifier. The output of the amplifier 78 on the lead 80 goes to the switch part 90, which is illustratively a single pole double throw type relay switch having an energizing coil 128. The state of the switch 90 illustrated in FIG. 7 is the slave mode state, which is the state of the switch 90 when there is no power applied to the distribution unit 60. In this state, the contact 130 is closed and the contact 132 is open. However, as will be described in full detail hereinafter, when power is applied to the distribution unit 60, the switch 90 reverts to the master mode state where the contact 132 is closed and the contact 130 is open.

With the distribution unit 38 in the slave mode and with the contact 130 being closed, the output of the amplifier 78 on the lead 80 is coupled to the input of the variable attenuator 116, which includes a p-i-n diode 136. The cathode of the diode 136 is coupled to the signal outlet 104 through the capacitor 138 and the anode of the diode 136 is coupled to the output 80 of the amplifier 78 through the capacitor 134 and the switch 90. In addition, the anode of the diode 136 is connected to a source of bias current through the resistor 142 and the cathode of the diode 136 is connected to the output lead 144 of the AGC circuit 112 through the inductor 146. As is known, the AGC circuit 112, by changing the voltage level on the output lead 144, varies the bias current through the diode 136 to control the attenuation on the signal passing therethrough.

The signal appearing at the signal inlet 102 of the distribution unit 38 is coupled through the capacitor 148 to the variable attenuator 106, which is of identical construction to the variable attenuator 116 and includes its respective p-i-n diode 152, whose cathode is coupled to the AGC circuit 112 output lead 144. The output of the variable attenuator 106 is connected to the input of the amplifier 108, which is illustratively of the same type as the amplifier 78. The output of the amplifier 108 passes through the directional coupler 110 which provides a portion of the signal on the lead 154 and passes the rest of the signal to the switch 94. The switch 94 is of the same construction as the switch 90 and includes a contact 156, a contact 158 and an energizing coil 160. With no power applied to the distribution unit 38, the state of the switch 90 is such that the contact 156 is closed and the contact 158 is open, which is the slave mode state of the switch 94. The default mode of this switch 94 when power is applied to the distribution unit 60 is the reverse, i.e., the contact 156 is open and the contact 158 is closed. With the contact 156 closed (the slave mode), the output of the amplifier 108, after passing through the directional coupler 110, is applied as the input to the splitter circuit 84 over the lead 82.

Figure 8:
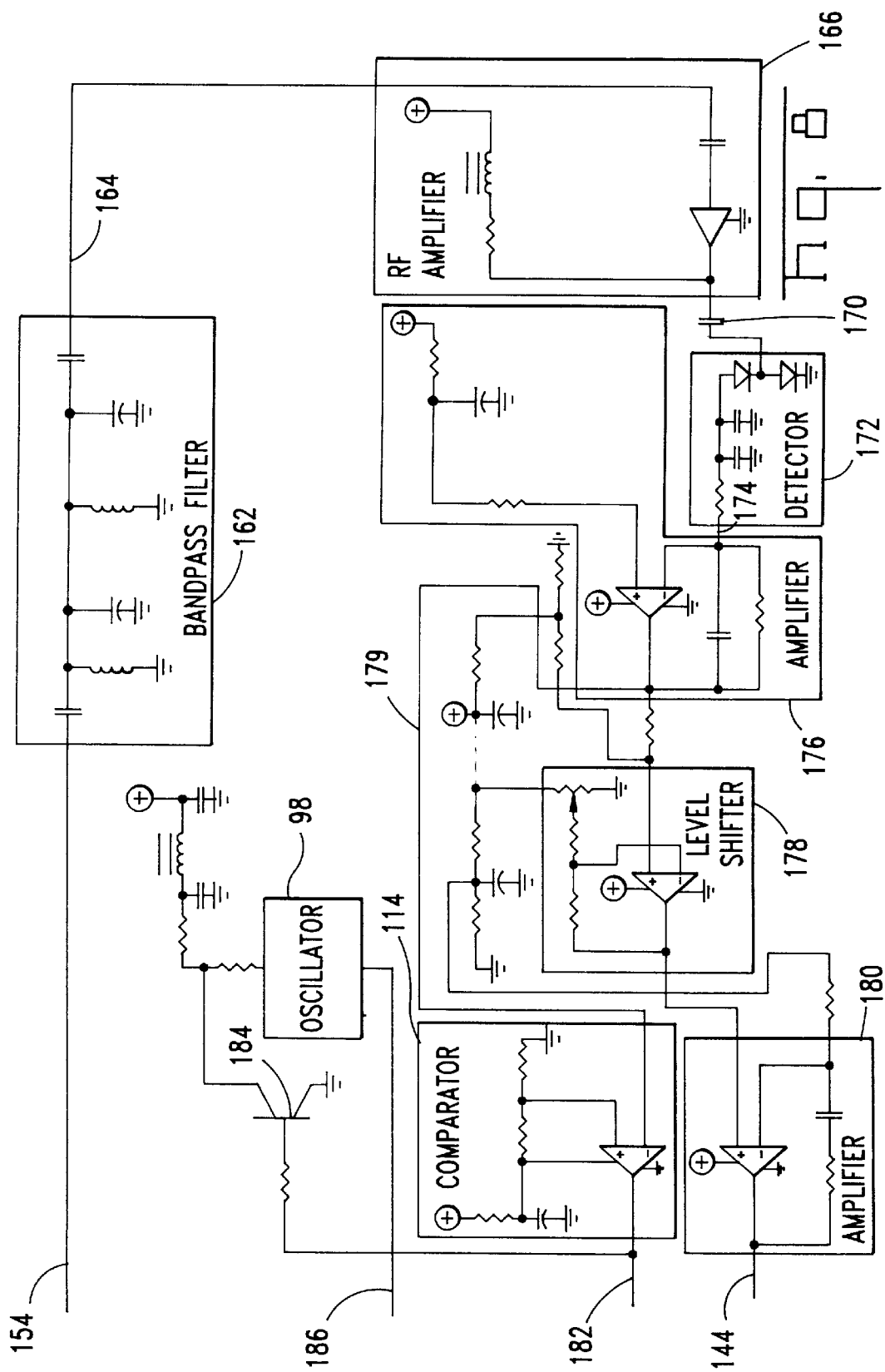

Referring now to FIG. 8, the signal appearing on the lead 154 is provided as an input to the bandpass filter 162 which allows the pilot signal to pass therethrough and appear on the lead 164 and blocks the signals within the specified frequency band of the RF carriers. The pilot signal on the lead 164 is provided as an input to the RF amplifier stage 166 of the AGC circuit 112. The output of the RF amplifier stage 166 is coupled by the capacitor 170 to the detector stage 172, which provides an output signal on the lead 174 to the DC amplifier stage 176. The output of the detector stage 172 is a lower voltage when the pilot signal is present than when it is not present and the amplifier stage 176 is an inverting amplifier. The output of the amplifier stage 176 is provided as an input to the level shifter stage 178, whose output is provided to the further amplifier stage 180. The output of the amplifier stage 180 is the AGC output lead 144, which goes to the variable attenuators 106, 116.

The output of the amplifier stage 176, in addition to going to the level shifter stage 178, is provided as an input over the lead 179 to the switch controller 114, which is illustratively a comparator. The output of the switch controller 114 on the lead 182 is high if the pilot signal is present and is low if the pilot signal is not present. Thus, the voltage level on the lead 182 determines whether the distribution unit 38 is operating in the slave mode or in the master mode. Thus, when power is initially applied to a distribution unit 38, if no other distribution units are connected, then there will be no pilot signal and the voltage level on the lead 182 will be low. The lead 182 is connected to control the energization of the coils 128, 160 of the switches 90, 94, respectively. The low level of the lead 182 is the default state of the distribution unit 60 and causes the coils 128, 160 to be energized, closing the contacts 132, 158 and placing the distribution unit 38 in the master mode. In this master mode, the output of the amplifier 78 is passed through the switch 90 to the lead 183, and thence to the transmission path 95. The lead 182 is also connected to the gate of the transistor 184, which functions as the switch part 92 (FIG. 2). With a low level on the lead 182, the transistor 184 is not conductive and power is applied to the oscillator circuit 98. Preferably, the oscillator circuit 98 is a fixed frequency crystal controlled oscillator which puts a fixed frequency oscillating signal on the lead 186. This signal goes through the directional coupler 100 to the transmission path 95 and then out to downstream distribution units, as described above.

In the downstream distribution units, the pilot signal is detected and the level of the lead 182 is high. This causes the transistor 184 to saturate and shunt the power away from the oscillator 98, thereby turning it off. In addition, the coils 128, 160 are not energized so that the contacts 130, 156 are closed, which is the slave mode of the distribution unit 38.

The distribution unit 60 further includes means for indicating whether the distribution unit 38 is operated in the master mode or the slave mode. Illustratively, this includes the light emitting diodes 188, 190 (FIG. 6), which are controlled by the respective transistors 192, 194. When the distribution unit 38 is in the master mode, the lead 182 is low, causing the transistor 192 to conduct, thereby energizing the light emitting diode 188. When the distribution unit 60 is in the slave mode, the lead 182 is high, causing the transistor 194 to conduct, thereby energizing the light emitting diode 190.

Figure 9:
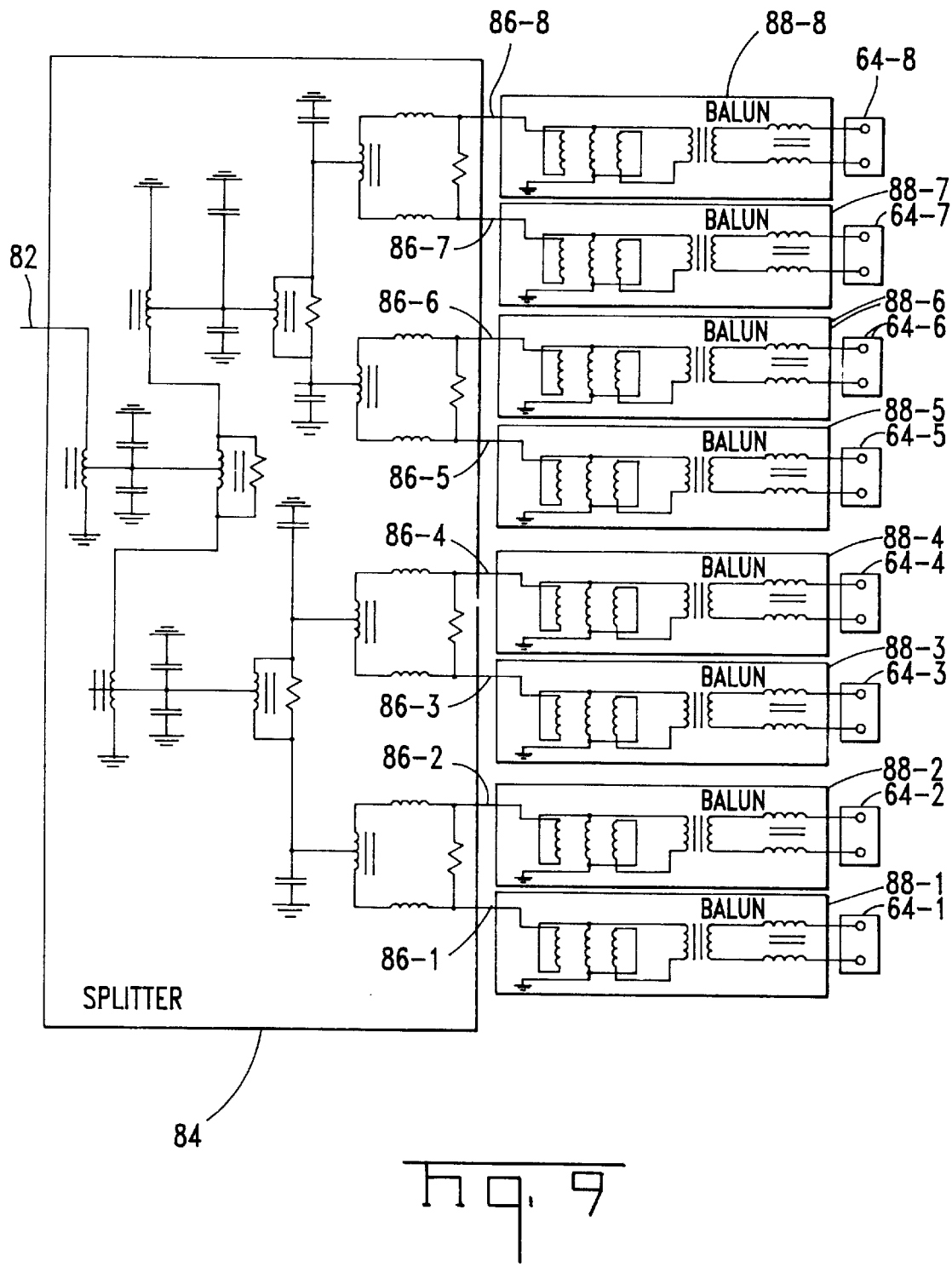

FIG. 9 illustrates the splitter circuit 84, the output baluns 88 and the output ports 64. This circuitry is substantially the inverse of the input circuitry and the combiner shown in FIG. 5.

Figure 10:
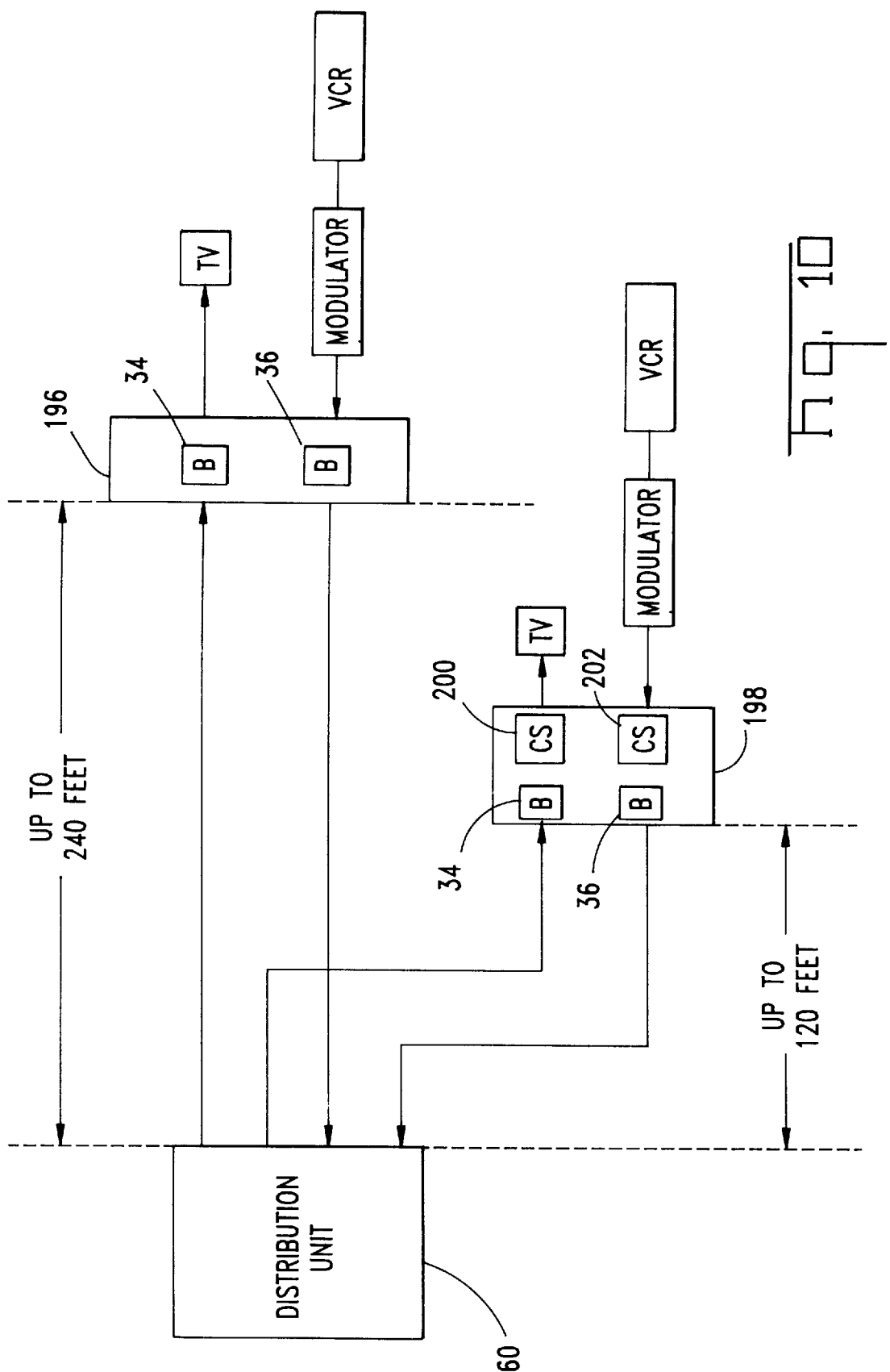
FIG. 10 illustrates how the cabling system according to the present invention accommodates different lengths of twisted pair wire cable.

As mentioned above, an attribute of the present system is that identical distribution units 38 can be utilized, no matter where they are disposed in the system. Since the outlets can be located at different distances from a distribution unit, some means must be provided to accommodate the different attenuations inherent in different lengths of twisted pair wire cable 32. Such an accommodation is shown in FIG. 10. Illustratively, the amplifications of the stages of the distribution unit 60 are selected to operate with an outlet 196 located 240 feet from the distribution unit 60. Such an outlet is constructed with built-in baluns 34, 36. For an outlet 198 located closer to the distribution unit 38, the baluns 34, 36 are supplemented by cable simulators 200, 202, respectively, on the unbalanced sides of the baluns, which add attenuation equivalent to the missing length of twisted pair wire cable 32. Thus, for the distant outlet 196, two hundred forty feet of twisted wire pair cable is utilized. For closer outlet 198, one hundred twenty feet of twisted pair wire cable is utilized and the cable simulators 200, 202 add an amount of attenuation equivalent to the missing one hundred twenty feet of twisted pair wire cable. Thus, all signals entering and leaving a distribution unit 38 are within a specified range of levels, irrespective of the distance to the outlet. However, as noted previously, where greater distances are to be gained by the use of coaxial cable or fiber optic cable.

Accordingly, there has been disclosed an improved wideband signal distribution system which is capable of utilizing twisted pair wire cable as the primary distribution media. While an illustrative embodiment of the present invention has been disclosed herein, it is understood that various modifications and adaptations to the disclosed embodiment will be apparent to those of ordinary skill in the art and it is intended that this invention be limited only by the scope of the appended claims. Thus, while the distribution of video signals has been specifically described, it is understood that the described system may also be used for distributing wideband signals generally.

What is claimed is:

1. A system for distributing wideband signals modulated onto RF carriers within a specified frequency band among a plurality of outlets comprising: a distribution unit including:
    a plurality of input ports;
    a plurality of output ports;
    a transmission path;
    combiner means for applying signals appearing at said plurality of input ports to said transmission path; and
    splitter means for applying signals appearing on said transmission path to all of said plurality of output ports;
    a plurality of cables selected from a class consisting of fiber optic cable, coaxial cable, and twisted pair wire cable, and extending between a respective one of said distribution unit ports and a respective one of said plurality of outlets; and
    a plurality of impedance matching devices, each of said devices terminating a respective end of a respective one of said cables.

2. The system according to claim 1 wherein said distribution unit further includes:
    a signal inlet;
    a signal outlet; and
    switch means operable to either a first state or a second state, said switch means when in its first state being effective to couple said transmission path to said combiner means and to said splitter means, and said switch means when in its second state being effective to couple said combiner means to said signal outlet instead of to said transmission path and to couple said splitter means to said signal inlet instead of to said transmission path; and
    wherein the system includes first and second of said distribution units with one of the output ports of the first distribution unit being connected to the signal inlet of the second distribution unit and one of the input ports of the first distribution unit being connected to the signal outlet of the second distribution unit, the switch means of the first distribution unit being in its first state, and the switch means of the second distribution unit being in its second state.

3. The system according to claim 2 wherein each of said distribution units further includes:

oscillator means for providing an oscillating pilot signal at a fixed frequency outside the specified frequency band of the RF carriers;

first controllable gain means interposed between said switch means and said signal outlet; and second controllable gain means interposed between said signal inlet and said switch means;

wherein said switch means when in its first state is further effective to couple said oscillator means to said transmission path; and wherein each of said distribution units further includes gain control means responsive to the level of said pilot signal for controlling the gain of said first and second gain means.

4. The system according to claim 3 wherein said switch means in each of said distribution units defaults to its first state and is responsive to the appearance of said pilot signal at said signal inlet for changing to its second state.

5. The system according to claim 3 wherein said first controllable gain means includes a first variable attenuator, said second controllable gain means includes a second variable attenuator and an amplifier having a fixed gain connected to the output of the second variable attenuator, and said gain control means is coupled to the output of said amplifier and to said first and second variable attenuators.

6. The system according to claim 5 wherein said first and second variable attenuators are substantially identical and each of said distribution units further includes an amplifier having a gain equal to the fixed gain of the amplifier of said second controllable gain means and connected between said combiner means and said switch means.

7. The system according to claim 3 wherein said distribution unit further includes directional coupling means for coupling said oscillator means to said transmission path and wherein said switch means is effective to remove power from said oscillator means when said switch means is in its second state.

8. The system according to claim 2 wherein said distribution unit further includes means for indicating the state of said switch means.

9. The system according to claim 1 wherein said distribution unit further includes signal equalizing means interposed in said transmission path.

10. The system according to claim 1 wherein there is an equal number of said input and output ports in said distribution unit.

11. The system according to claim 1 wherein said cables include twisted pair wire cables and said impedance matching devices include baluns, said system further comprising a first group of baluns arranged as part of said distribution unit and located between said combiner means and said plurality of input ports;

a second group of baluns arranged as part of said distribution unit and located between said splitter means and said plurality of output ports; and a third group of baluns located at the ends of said cables remote from said distribution unit.

12. The system according to claim 1 wherein said cables include fiber optic cables and said impedance matching devices include an optoelectric transceiver.

13. The system according to claim 1 wherein said cables include coaxial cables and said impedance matching devices include a transformer.

14. The system according to claim 11 wherein said plurality of twisted pair cables are all of the same type and are either within a first length range or a second length range plus a third length range equal to the maximum length of said first length range the system further including cable simulator means connected to those baluns of the third group of baluns which are connected to the cables of the second length range for simulating a length of cable equal to the maximum length of said third length range.

15. A distribution unit for use in a wideband signal distribution system, where the system includes a plurality of outlets and a plurality of cables extending between the outlets and the distribution unit for carrying wideband signals modulated onto RF carriers within a specified frequency band between the outlets, the distribution unit comprising:

a plurality of input ports each adapted to be connected to a respective one of said cables;

a first plurality of impedance matching devices each having its balanced end connected to a respective one of said input ports;

a combiner having a plurality of input terminals each connected to the unbalanced end of a respective one of said first plurality of impedance matching devices and having an output terminal to which is applied a combined signal which is an additive combination of all signals appearing at said input ports;

a splitter having an input terminal and a plurality of output terminals to all of which is applied a signal appearing at the splitter input terminal;

a second plurality of impedance matching devices each having its unbalanced end connected to a respective one of said splitter output terminals;

a plurality of output ports each connected to the balanced end of a respective one of said second plurality of impedance matching devices and each adapted to be connected to a respective one of said cables; and a transmission path coupled between said combiner output terminal and said splitter input terminal.

16. The distribution unit according to claim 15 further comprising:

a signal inlet adapted to be coupled to a cable extending to an output port of another distribution unit of identical construction;

a signal outlet adapted to be coupled to a cable extending to an input port of said another distribution unit; and switch means operable to either a first state or a second state, said switch means being coupled to said transmission path, said combiner output terminal, said splitter input terminal, said signal inlet and said signal outlet, said switch means when in its first state being effective to couple said transmission path to said combiner output terminal and said splitter input terminal, and said switch means when in its second state being effective to couple said combiner output terminal to said signal outlet and to couple said signal inlet to said splitter input terminal.

17. The distribution unit according to claim 16 further comprising:

an oscillator providing a fixed frequency pilot signal outside the specified frequency band of the RF carriers; and switch control means responsive to the presence of said pilot signal at said signal inlet for controlling said switch means to assume its second state;

wherein the default state of said switch means is its first state and wherein said switch means when in its first state is further effective to couple said oscillator fixed frequency pilot signal to said transmission path.

18. The distribution unit according to claim 17 further comprising:

first controllable gain means coupled between said signal outlet and said switch means;

second controllable gain means coupled between said signal inlet and said switch means; and gain control means having an input coupled between said second controllable gain means and said switch means and responsive to the level of said pilot signal for controlling the gain of both said first and second gain means.

19. The distribution unit according to claim 18 further comprising:

a directional coupler having an input interposed between said second gain means and said switch means and an output coupled to the input of said gain control means; and wherein said gain control means includes a bandpass filter tuned to pass said pilot signal, said bandpass filter being serially connected between said gain control means input and the remainder of said gain control means.

20. The distribution unit according to claim 18 wherein:

ech of said first and second gain means includes a variable attenuator having a p-i-n diode with its cathode connected to the respective signal inlet or outlet and its anode connected to the switch means, and a source of bias current connected to the anode of the p-i-n diode; and the gain control means has an output connected to the cathode of the p-I-n diode to vary the bias current therethrough.

21. The distribution unit according to claim 19 wherein said switch control means is coupled to said bandpass filter remote from said gain control means input.

22. The distribution unit according to claim 15 further comprising signal equalizing means interposed in said transmission path.

23. The distribution unit according to claim 16 further comprising means for indicating the state of said switch means.

24. The distribution unit according to claim 17 further comprising:

a first light emitting diode;

a second light emitting diode;

a first voltage source coupled to the anodes of the light emitting diodes;

a second voltage source at a level less than the level of the first voltage source coupled to the cathodes of the light emitting diodes;

first controllable switching means connected in series with said first light emitting diode and having a control input;

second controllable switching means connected in series with said second light emitting diode and having a control input; and means for coupling said switch control means to the control inputs of said first and second controllable switching means;

wherein said first and second controllable switching means respond to different level signals at their control inputs to provide current paths for their respective light emitting diodes and said switch control means provides said different level signals corresponding to respective states of said switch means.

\* \* \* \* \*